US011238192B2

(12) United States Patent
Nonaka et al.

(10) Patent No.: US 11,238,192 B2
(45) Date of Patent: Feb. 1, 2022

(54) SUPPORT APPARATUS

(71) Applicant: Hitachi, Ltd., Tokyo (JP)

(72) Inventors: Norihiko Nonaka, Tokyo (JP); Ichiro Kataoka, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 323 days.

(21) Appl. No.: 16/479,765

(22) PCT Filed: Jan. 29, 2018

(86) PCT No.: PCT/JP2018/002637
§ 371 (c)(1),
(2) Date: Jul. 22, 2019

(87) PCT Pub. No.: WO2018/147104
PCT Pub. Date: Aug. 16, 2018

(65) Prior Publication Data
US 2019/0362038 A1  Nov. 28, 2019

(30) Foreign Application Priority Data

Feb. 7, 2017  (JP) .............................. JP2017-019999

(51) Int. Cl.
*G06F 30/20* (2020.01)
*G06N 3/08* (2006.01)
*G06F 30/17* (2020.01)

(52) U.S. Cl.
CPC .............. *G06F 30/20* (2020.01); *G06F 30/17* (2020.01); *G06N 3/08* (2013.01)

(58) Field of Classification Search
None
See application file for complete search history.

(56) References Cited

U.S. PATENT DOCUMENTS

| 2010/0250200 A1 | 9/2010 | Mori et al. |
| 2011/0178789 A1* | 7/2011 | Miranda |
| 2013/0325422 A1* | 12/2013 | Nonaka |

FOREIGN PATENT DOCUMENTS

| JP | 6-19876 A | 1/1994 |
| JP | 2009-93271 A | 4/2009 |

(Continued)

OTHER PUBLICATIONS

Soo-Yong Cho, Optimal design of a centrifugal compressor impeller using evolutionary algorithms, May 29, 2012, pp. 1-23 (Year: 2012).*

(Continued)

*Primary Examiner* — Syed A Roni
(74) *Attorney, Agent, or Firm* — Crowell & Moring LLP

(57) ABSTRACT

A design support apparatus that outputs a plurality of pairs of output parameters for a pair of input parameters is provided. The apparatus includes: an analysis controlling unit that generates a sampling point in design space based on an input parameter, performs calculation in accordance with the sampling point, and acquires a calculation result as an output parameter; a machine learning unit that performs machine learning on a relationship between the input and output parameters; a design plan generating unit that calculates a design plan corresponding to information learned by the machine learning unit; a visualizing unit that visualizes the design space, and displays the calculation result and the design plan in the visualized design space; a design region unit that specifies a region in a vicinity of the design plan in the visualized design space; and an output unit that outputs the calculation result contained in the region.

3 Claims, 9 Drawing Sheets

(56) References Cited

FOREIGN PATENT DOCUMENTS

JP            2012-3524 A     1/2012
WO    WO 2009/044850 A1    4/2009

OTHER PUBLICATIONS

International Search Report (PCT/ISA/210) issued in PCT Application No. PCT/JP2018/002637 dated Mar. 6, 2018 with English translation (five pages).
Japanese-language Written Opinion (PCT/ISA/237) issued in PCT Application No. PCT/JP2018/002637 dated Mar. 6, 2018 (three pages).
Kataoka et al., "Development of Machine Learning Technology for Product Design Space", $12^{th}$ Optimization Symposium 2016, Japan Society of Mechanical Engineers, Dec. 5, 2016, with unverified partial translation (two pages).
Nonaka et al., "Development of Parameter survey Support Analysis System for Optimization", $12^{th}$ Optimization Symposium 2016, Japan Society of Mechanical Engineers, Dec. 5, 2016, with unverified partial translation (two pages).

\* cited by examiner

FIG. 6

| | LOWER LIMIT VALUE | UPPER LIMIT VALUE |
|---|---|---|

ANALYSIS MODEL NAME : CENTRIFUGAL COMPRESSOR

| | LOWER LIMIT VALUE | UPPER LIMIT VALUE |
|---|---|---|
| SUCTION PRESSURE | 0.1MPa | |
| PRESSURE RATIO | 1.1 | 4.0 |
| SUCTION TEMPERATURE | 40°C | 60°C |
| FLOW RATE | 2,000m³/h | 50,000m³/h |
| MOLECULAR WEIGHT | 10 | 25 |
| NUMBER OF SAMPLING POINTS | 10000 | |

DETERMINATION   CANCEL

FIG. 7

ANALYSIS MODEL NAME : CENTRIFUGAL COMPRESSOR

PRESSURE RATIO: 2.5

SUCTION TEMPERATURE: 55°C

FLOW RATE: 27,000m³/h

MOLECULAR WEIGHT: 20

DETERMINATION    CANCEL

FIG. 9

| | PRES-SURE RATIO | SUCTION TEMPERATURE | FLOW RATE | MOLECU-LAR WEIGHT | IMPELLER STAGE NUMBER | IMPELLER OUTER DIAMETER | IMPELLER ROTATION NUMBER | EFFI-CIENCY | HEAD | SHAFT POWER |
|---|---|---|---|---|---|---|---|---|---|---|
| PREDIC-TION | 3.5 | 55 | 27000 | 20 | 3 | 650 | 8150 | 85 | 12500 | 9500 |
| VICINITY | 3.5 | 54 | 26900 | 20.1 | 2 | 700 | 8200 | 87 | 12501 | 9510 |
| VICINITY | 3.47 | 56 | 27010 | 19.8 | 3 | 660 | 8000 | 86 | 12505 | 9490 |
| VICINITY | 3.51 | 54 | 27020 | 20.2 | 3 | 640 | 8300 | 86 | 12503 | 9505 |
| VICINITY | 3.55 | 57 | 26950 | 19.7 | 2 | 710 | 8250 | 86 | 12502 | 9510 |

SUPPORT APPARATUS

TECHNICAL FIELD

The present invention relates to a design support apparatus.

BACKGROUND ART

In a design support technique, simulation technology or a response surface model is used to calculate, for example, the configuration or the performance such as efficiency of a mechanical structure. In such a technique, one input parameter corresponds to one output parameter. Taking a case, in which the operation condition of the mechanical structure is set as the input parameter and the configuration or performance of a device is set as the output parameter, for an example, one configuration and one performance are output for input operation condition. Change of the configuration of the mechanical structure, however, results in a mechanical structure that satisfies the same operation condition. That is, there can be a plurality of output parameters that satisfy the input parameter for the input parameter.

For example, PTL 1 discloses an apparatus that creates an L-row orthogonal table for set design parameters, performs multiple times of virtual prototyping by adding tolerances of the dimensions of parts for each of L pairs of design parameter groups, creates a response surface model by processing the average value and dispersion amount of L pairs of evaluation indexes obtained by the virtual prototyping and creating a response surface, creates factor-effect diagrams of the design parameters for each evaluation index, examines the factor-effect diagrams, creates any combination of the design parameters having sensitivity for the evaluation index, creates multiple design solutions obtained by optionally combining all the design parameters, with which a design target value can be achieved by applying the combination to the response surface model, selects a maximum-likelihood-design-solution group by performing filtering for extracting the maximum-likelihood-design-solution candidate groups, which achieve a limit value of the evaluation index specified by the design solution group, and represents the maximum-likelihood-design-solution group for a user.

In addition, a method of calculating the performances of a plurality of mechanical structures based on past data is used in an apparatus for calculating the performance of a mechanical structure. A server apparatus of a steel design support system in PTL 2 retrieves, from past case database, a past case containing a required specification that partially matches a required specification given from a client apparatus, retrieves a steel type that belongs to the same group as the steel type that has been used in the retrieved past case, and determines whether the retrieved steel type satisfies the required specification. The determination result is transmitted from the server apparatus to the client apparatus. An apparatus in which the client apparatus displays the determination result is disclosed.

CITATION LIST

Patent Literature

PTL 1: JP 2009-93271 A
PTL 2: JP 2012-3524 A

SUMMARY OF INVENTION

Technical Problem

The apparatus disclosed in PTL 1 generates output parameters from multiple design parameters (input parameters), and obtains a plurality of output parameters using a retrieval function. Unfortunately, generation of multiple design parameters for a pair of input parameters is not sufficiently considered in the method.

PTL 2 discloses a method of retrieving and obtaining past data to output a plurality of output parameters based on past data. In this case, there arises a problem that know-how on how to retrieve, for example, a retrieval keyword is required. There also arises a problem that sufficient results cannot be obtained since the past data is generally small in number.

An object of the invention is to provide a design support apparatus that outputs a plurality of pairs of output parameters for a pair of input parameters.

Solution to Problem

In order to solve the above-described problems, a design support apparatus according to the invention includes: an analysis controlling means that generates a sampling point in design space based on an input parameter, performs calculation under a condition in accordance with the sampling point, and acquires a calculation result as an output parameter; a machine learning means that performs machine learning on a relationship between the input parameter and the output parameter; a design plan generating means that calculates a design plan corresponding to a required specification with reference to information learned by the machine learning means; a visualizing means that visualizes the design space, and displays the calculation result and the design plan calculated by the design plan generating means in the visualized design space; a means that specifies a region in a vicinity of the design plan calculated by the design plan generating means in the visualized design space; and a means that outputs the calculation result contained in the region in the vicinity of the design plan calculated by the design plan generating means as a design plan satisfying the required specification.

Advantageous Effects of Invention

According to the invention, a design support apparatus that outputs a plurality of pairs of output parameters for a pair of input parameters can be provided.

BRIEF DESCRIPTION OF DRAWINGS

FIG. 6 illustrates a diagram of one example of an input screen for an analysis condition.

FIG. 7 illustrates a diagram of one example of an input screen for a required specification.

FIG. 9 illustrates a table of one example of a display screen for a design plan.

DESCRIPTION OF EMBODIMENTS

An embodiment will be described below with reference to the drawings.

First Embodiment

Figure 1:
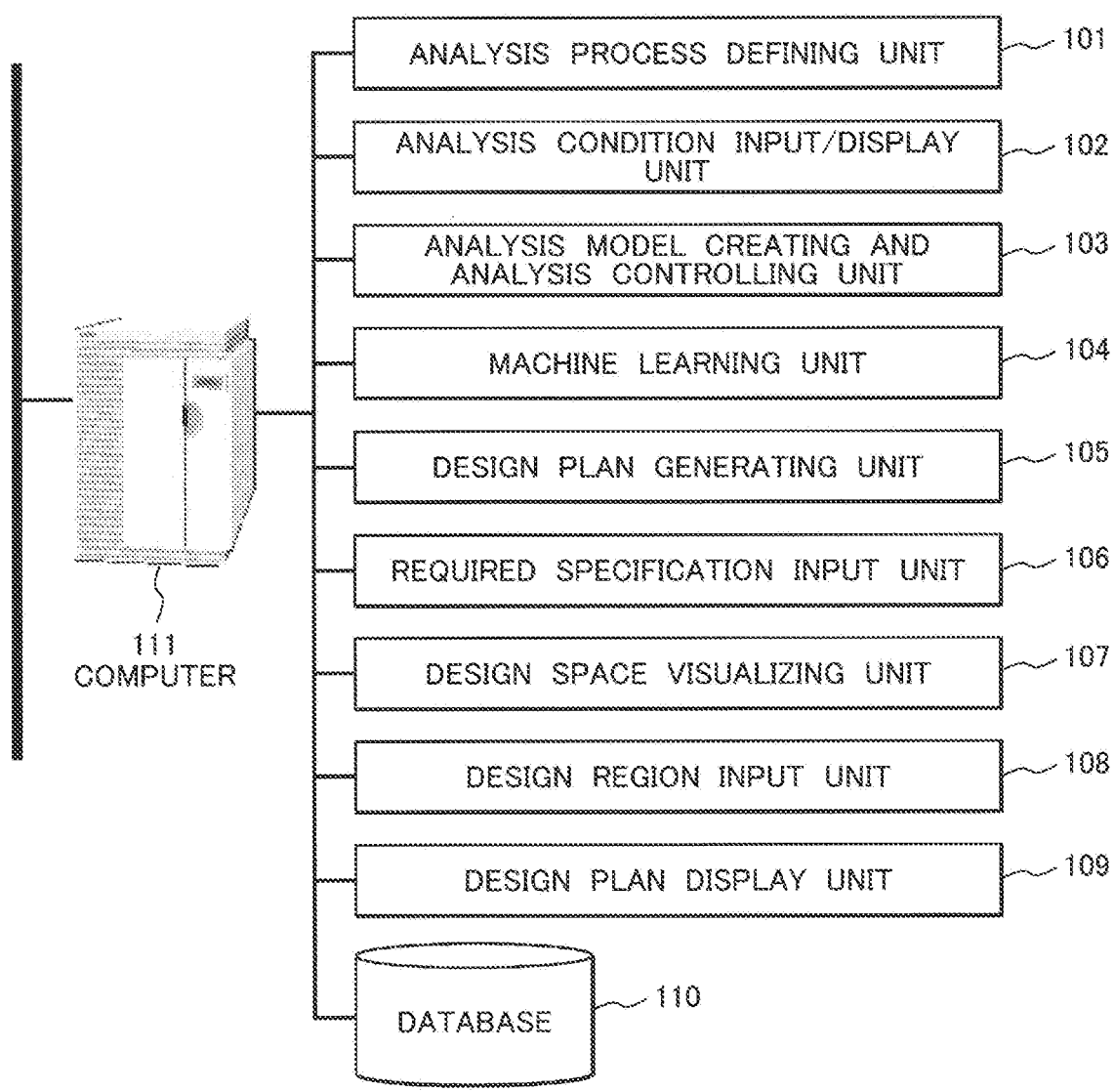
FIG. 1 is an entire configuration diagram of a design support apparatus according to a first embodiment.

FIG. 1 is a configuration diagram of a design support apparatus according to a first embodiment. The design support apparatus includes an analysis process defining unit 101, an analysis condition input/display unit 102, an analysis model creating and analysis controlling unit 103, a machine learning unit 104, a design plan generating unit 105, a required specification input unit 106, a design space visualizing unit 107, a design region input unit 108, a design plan display unit 109, a database 110, and a computer 111.

In the analysis process defining unit 101, an analysis process input screen is displayed, an analysis process is input by an operator dragging and dropping an analysis node in which an analysis model name and an analysis program is built, information on the input analysis process is displayed, and the input information is stored in the database 110.

In the analysis condition input/display unit 102, an analysis condition screen is displayed, an input condition necessary for analysis is displayed, and an input parameter in accordance with the input condition is acquired. The operator inputs the input condition necessary for analysis in the analysis condition screen with respect to the analysis model input at the analysis process defining unit 101, and stores the input information in the database 110.

The analysis model creating and analysis controlling unit 103 generates a sampling point in design space based on the input parameter, performs calculation under the condition in accordance with the sampling point, and acquires the calculation result as an output parameter. The analysis model creating and analysis controlling unit 103 acquires information input at the analysis process defining unit 101 and the analysis condition input/display unit 102, and creates an analysis model in accordance with the analysis process based on the information. The analysis model creating and analysis controlling unit 103 also generates the sampling point in the design space, and performs calculations for the number of sampling points under the condition in accordance with the sampling points. When the calculation is completed, the analysis model creating and analysis controlling unit 103 stores the calculation condition information and the calculation result in the database 110.

The machine learning unit 104 performs machine learning on the relationship between the input parameter and the output parameter. The machine learning unit 104 acquires all information from the database 110, performs machine learning on the relationship between the input parameter and the output parameter by a method through a neural network defining the calculation condition information on the sampling point as the input parameter and the calculation result as the output parameter, and inputs information on the learned result in the database 110. Although, in the first embodiment, machine learning is performed by the method through the neural network, the method of machine learning is not limited to the method through the neural network.

The design plan generating unit 105 calculates a design plan in accordance with a required specification with reference to the learned information. The design plan generating unit 105 generates the design plan through the neural network with reference to the information learned at the machine learning 104 based on the required specification input to the required specification input unit 106. Although, in the first embodiment, the design plan is generated through the neural network, the method of generating a design plan is not limited to the method through the neural network.

The required specification input unit 106 displays a required specification input screen, and acquires the input required specification.

The design space visualizing unit 107 displays, in the visualized design space, the calculation result from the analysis model creating and analysis controlling unit and the design plan calculated by the design plan generating unit. For example, the design space visualizing unit 107 acquires all information from the database 110, displays a diagram, which is obtained by subjecting the information calculated at the analysis model creating and analysis controlling unit 103 to principal component analysis with a scatter diagram representing correlation, on the design space visualizing screen, and also displays the design plan generated at the design plan generating 105.

The design region input unit 108 specifies a region in the vicinity of the design plan calculated by the design plan generating means in the visualized design space. For example, the design region input unit 108 specifies a region in the vicinity of the design plan obtained by the design plan generating unit 105 via a user interface in a design space visualizing screen displayed by the design space visualizing unit 107.

The design plan display unit 109 acquires data contained in the region in the vicinity of the design plan input from the design region input unit 108 in the design space visualizing screen displayed by the design space visualizing unit 107, and displays the data on a design plan display screen.

The database 110 accumulates data obtained at the analysis model input/display unit 101, the analysis condition input/display unit 102, the analysis model creating and analysis controlling unit 103, the machine learning unit 104, the design plan generating unit 105, the required specification input unit 106, the design space visualizing unit 107, the design region input unit 108, and the design plan display unit 109.

The computer 111 controls the analysis process defining unit 101, the analysis condition input/display unit 102, the analysis model creating and analysis controlling unit 103, the machine learning unit 104, the design plan generating unit 105, the required specification input unit 106, the design space visualizing unit 107, the design region input unit 108, the design plan display unit 109, and the database 110. The computer 111 controls transmission and receipt of the data.

Figure 2:
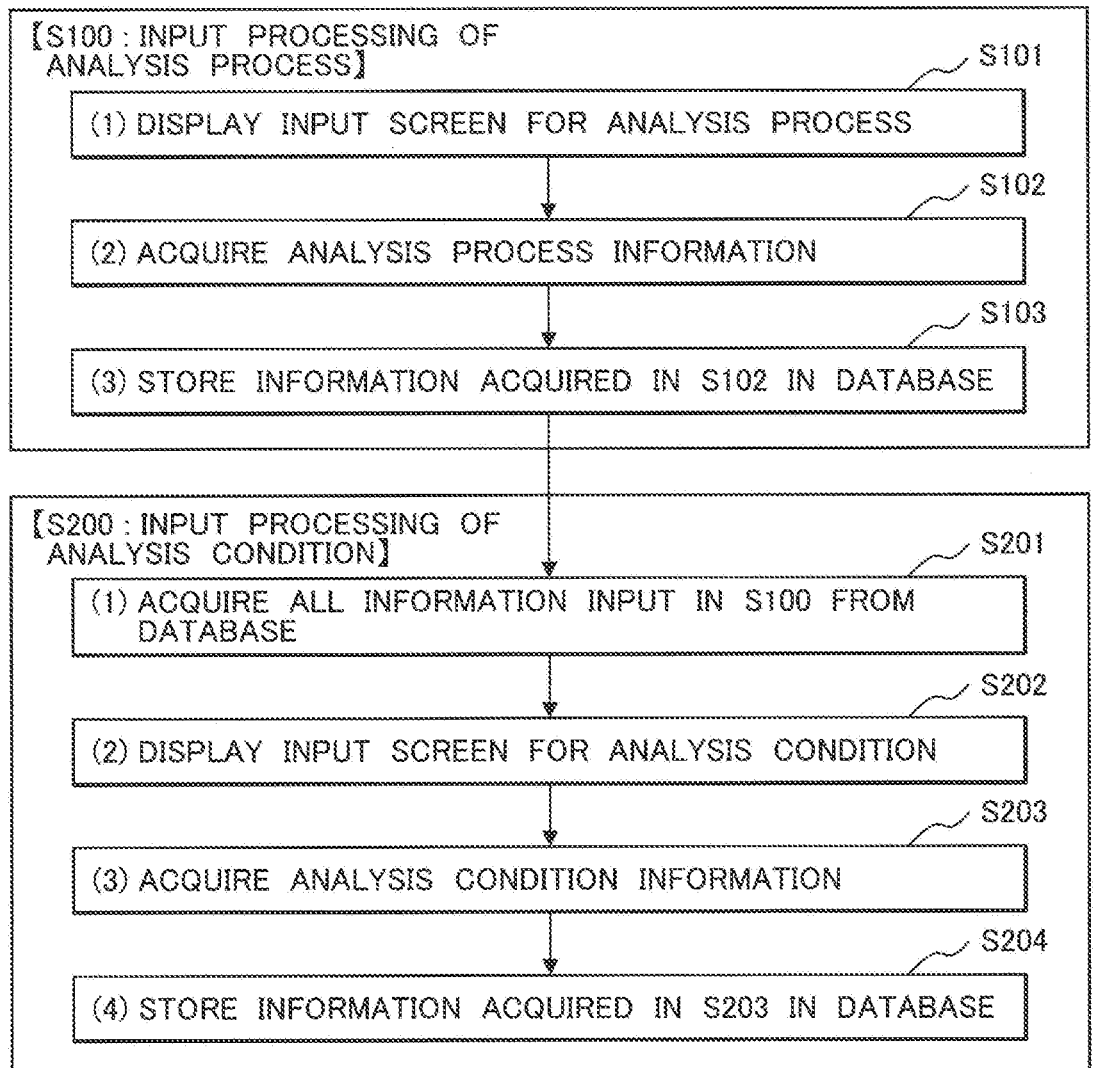
FIG. 2 illustrates a flowchart of a processing procedure (phase 1) of the first embodiment.
Figure 3:
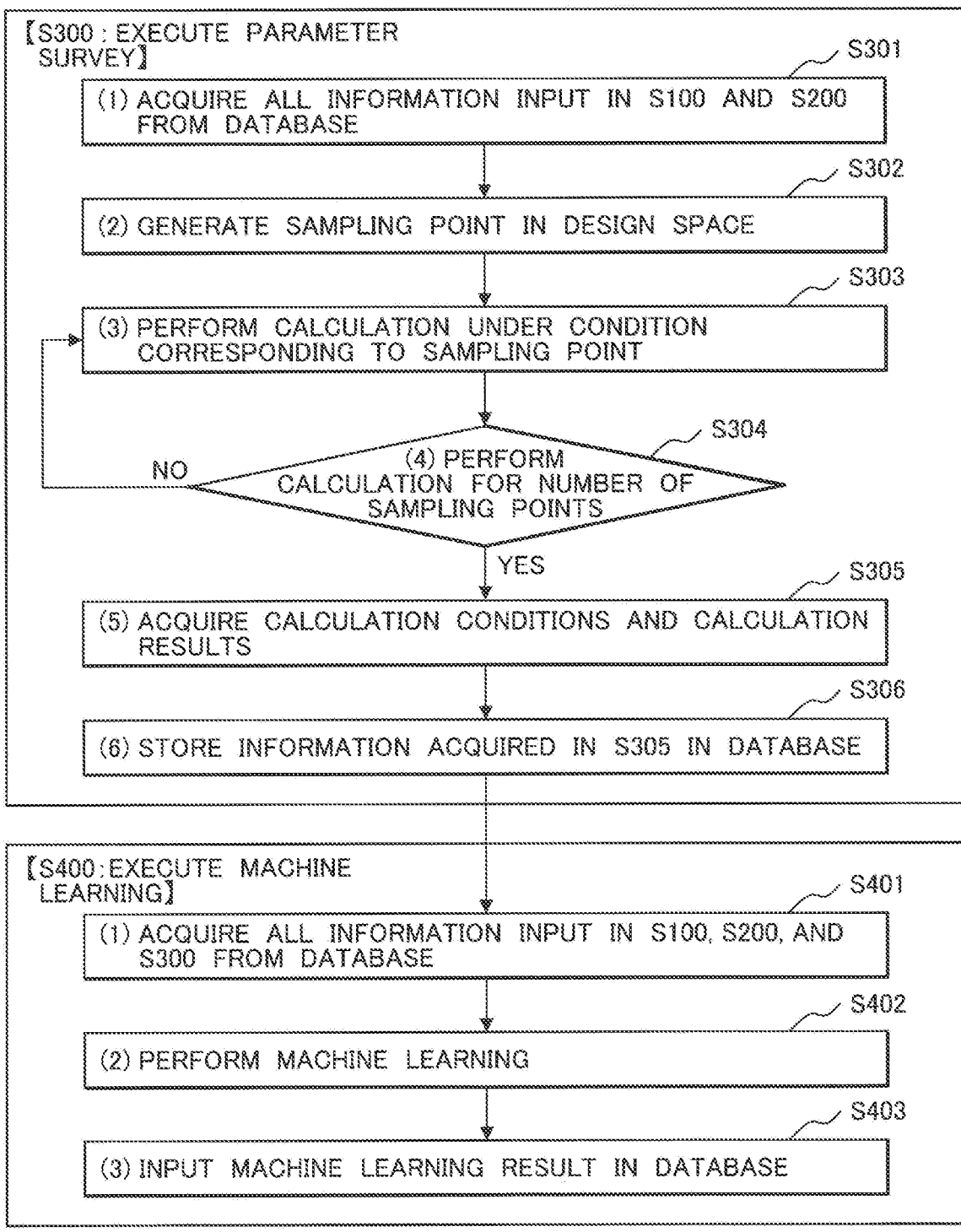
FIG. 3 illustrates a flowchart of the (subsequent) processing procedure (phase 1) of the first embodiment.
Figure 4:
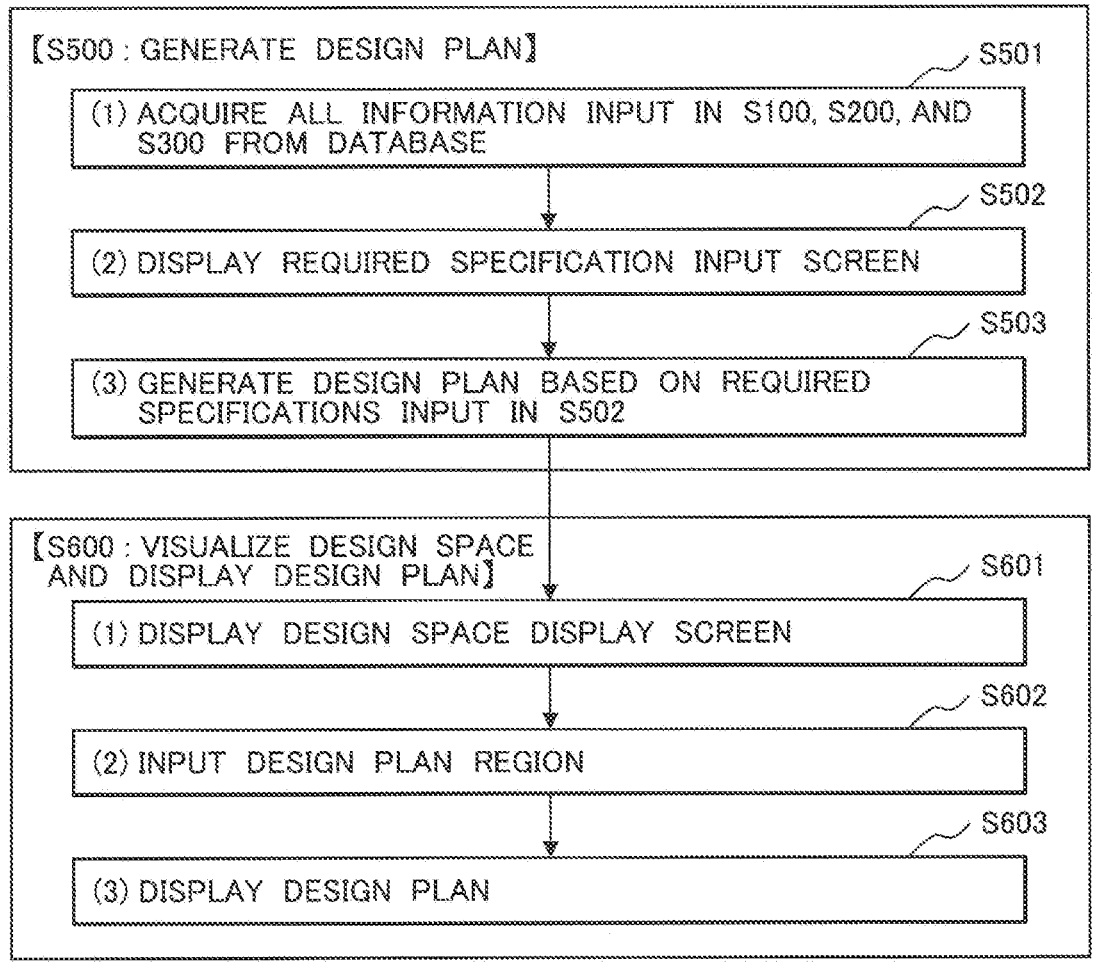
FIG. 4 illustrates a flowchart of a processing procedure (phase 2) of the first embodiment.

In relation to the processing process of the embodiment configured in such a way, FIGS. 2 to 4 are flowcharts illustrating a processing procedure in the design support apparatus illustrated in FIG. 1. The procedure of the first embodiment is divided into two major phases. In a phase 1, an analysis process and a condition for analysis are input, analysis corresponding to the condition is performed, and machine learning is performed with reference to the analysis result. In the phase 2, a required specification for a mechanical structure to be designed is input, a design plan based on the input required specification is generated, design space is visualized, and a plurality of design plans is displayed.

A method of obtaining a plurality of design plans for one required specification (one pair of input parameters) will be described by taking a centrifugal compressor of a mechanical structure for an example. To perform compression, centrifugal compressors suction gas by rotating an impeller, and gradually decelerate the gas in the centrifugal direction. To compress gas, the centrifugal compressors usually include not one but a plurality of impellers.

FIGS. 2 and 3 illustrate a processing procedure of the phase 1.

In S100, the analysis process defining unit 101 performs input processing of an analysis process.

Figure 5:
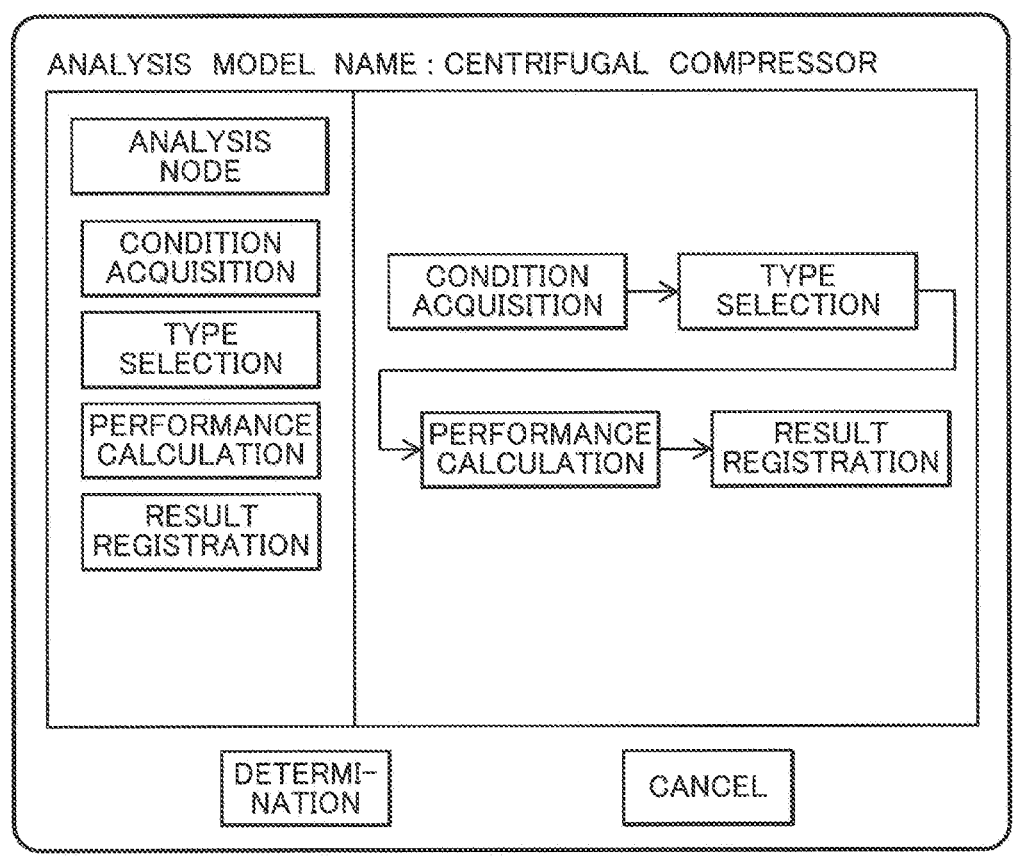
FIG. 5 illustrates a diagram of one example of an analysis process definition screen.

In S101, the analysis process defining unit 101 displays an input screen for the analysis process. FIG. 5 illustrates one example of the input screen for the analysis process. An operator inputs an analysis process to be analyzed. Here, a centrifugal compressor is input as an analysis model. A block called an analysis node is displayed on the left part of the input screen. A program is built in the block. Taking "condition acquisition" for an example, a program for acquiring a condition for analysis is built in the block. Here, the block is called an analysis node. In addition, in the analysis node, the built-in program can be executed. A program for calculating a parameter characterizing the centrifugal compressor is built in "type selection". The parameter includes the number of stages of an impeller, the outer diameter of the impeller, and the rotation number of the impeller, which correspond to input parameters. A program for predicting the performance of the centrifugal compressor, such as a head and efficiency, is built in "performance calculation". A program for registering the calculation result in the database 110 is built in "result registration". The operator defines an analysis procedure by dragging the analysis node displayed on the analysis node and dropping the analysis node on the right side of the screen. Here, the analysis node is input in the order of the "condition acquisition", "type selection", "performance calculation", and "result registration".

In S102, analysis process information is acquired in the order of the "condition acquisition", "type selection", "performance calculation", and "result registration" input in S101.

In S103, the information obtained in S102 is stored in the database 110.

In S200, the analysis condition input/display unit 102 performs input processing of an analysis condition.

In S201, the information input at the analysis process defining unit 101 is acquired from the database 110.

In S202, the analysis condition input/display unit 102 displays an input screen for the analysis condition. FIG. 6 illustrates one example of the input screen for the analysis condition. The operator inputs the analysis condition for analysis. Here, a centrifugal compressor is input as an analysis model name. A suction pressure of 0.1 megapascal (MPa) is input as the analysis condition. In addition, an upper limit value and a lower limit value are input for each of pressure ratio, suction temperature, flow rate, and molecular weight. A lower limit value of 1.1 and an upper limit value of 4.0 are input for the pressure ratio. A lower limit value of 40° C. and an upper limit value of 60° C. are input for the suction temperature. A lower limit value of 2000 m$^3$/h and an upper limit value of 50000 m$^3$/h are input for the flow rate. A lower limit value of 10 and an upper limit value of 25 are input for the molecular weight. The conditions are necessary for calculation for the centrifugal compressor. In addition, the number 10000 of sampling points is input.

In S203, the analysis condition input in S202 is acquired.

In S204, the information obtained in S203 is stored in the database 110.

In S300, the analysis model creating and analysis controlling unit 103 performs a parameter survey.

In S301, all information input in S100 and S200 is acquired from the database 110.

In S302, a sampling point is generated in the design space. Here, the sampling point is generated in the design space of the parameters input in S202. That is, 10000 sampling points are generated in the design space in which the lower limit value of 1.1 and the upper limit value of 4.0, the lower limit value of 40° C. and the upper limit value of 60° C., the lower limit value of 2000 m$^3$/h and the upper limit value of 50000 m$^3$/h, and the lower limit value of 10 and the upper limit value of 25 are set for the pressure ratio, the suction temperature, the flow rate, and the molecular weight, respectively. Although several methods of generating a sampling point are used, the sampling points here are generated by a latin hypercube sampling method (LHS).

In S303, one of the sampling points generated in S302 is selected, and calculation is performed in accordance with the analysis process input in S102 under the condition corresponding to the selected sampling point. Here, the calculation is performed in the order of the "condition acquisition", "type selection", "performance calculation", and "result registration".

In S304, it is determined whether calculation has been performed at all sampling points. When the calculation has not been performed, the processing returns to S303, one of the sampling points at which the calculation has not been performed is selected, and calculation is performed in accordance with the analysis process input in S102 under the condition corresponding to the selected sampling point. When all the sampling points have been performed, the processing proceeds to S305. Here, calculations for the number of sampling points input in S202 are performed. In the embodiment, 10000 calculations are performed.

In S305, calculation condition information and calculation results for the sampling points generated in S302 and S303 are acquired.

In S306, the information acquired in S305 is stored in the database 110.

In S400, the machine learning unit 104 performs machine learning.

In S401, all information input in S100, S200, and S300 is acquired from the database 110.

In S402, the machine learning unit 104 performs machine learning on the relationship between an input parameter and an output parameter using the calculation condition information of the sampling point as the input parameter and the calculation result as the output parameter. Table 1 illustrates input parameters and output parameters in the embodiment.

TABLE 1

| Input parameter | Output parameter |
| --- | --- |
| Pressure ratio | Impeller stage number |
| Suction temperature | Impeller outer diameter |
| Flow rate | Impeller rotation number |
| Molecular weight | Efficiency |
|  | Head |
|  | Shaft power |

In the first embodiment, machine learning is performed using information on 10000 sample points. Although there are several methods of machine learning, a neural network is used here. The neural network is a mathematical model intended to express the characteristics of a brain consisting of a large number of nerve cells by computer simulation. The neural network is given by the following recurrence formula, where each of layers of artificial neurons is defined as $X_i$.

$$X_{i+1}=f(A_iX_i+B_i) \quad \text{Formula (1)}$$

Here, $A_i$ and $B_i$ are a weight parameter and a bias parameter, respectively. An activation function is expressed by f. The weight parameter and the bias parameter are determined through the machine learning. It should be noted that, in the case of three layers, $X_1$, $X_2$, and $X_3$ correspond to an input layer, an intermediate layer, and an output layer, respectively.

In S403, the result of the machine learning is stored in the database. Here, the weight parameter and the bias parameter correspond to the learning result.

The phase 2 will be described with reference to FIG. 4.

In S500, the design plan generating unit 105 generates a design plan based on the required specification input by the required specification input unit 106.

In S501, all information input in S100, S200, and S300 is acquired from the database 110.

In S502, the required specification input unit 106 displays an input screen. FIG. 7 illustrates one example of the input screen. The operator inputs a required specification for the centrifugal compressor to be designed. The required specification corresponds to the input parameter in Table 1. A centrifugal compressor is input as an analysis model name. Here, a pressure ratio of 2.5, a suction temperature of 55° C., a flow rate of 27000 m³/h, and a molecular weight of 20 are input as the required specifications.

In S503, the design plan generating unit 105 generates a design plan using the required specifications input in S502 as the input parameters. Here, a design plan is generated by the neural network given in Formula (1) based on the information obtained by the machine learning at the machine learning unit 104. The design plan means the output parameters illustrated in Table 1.

In S600, the design space visualizing unit 107 visualizes design space, the design region input unit 108 inputs a specified region of the design space, and the design plan display unit 109 displays a plurality of design plans together with the design plan obtained at the design plan generating unit 105.

Figure 8:
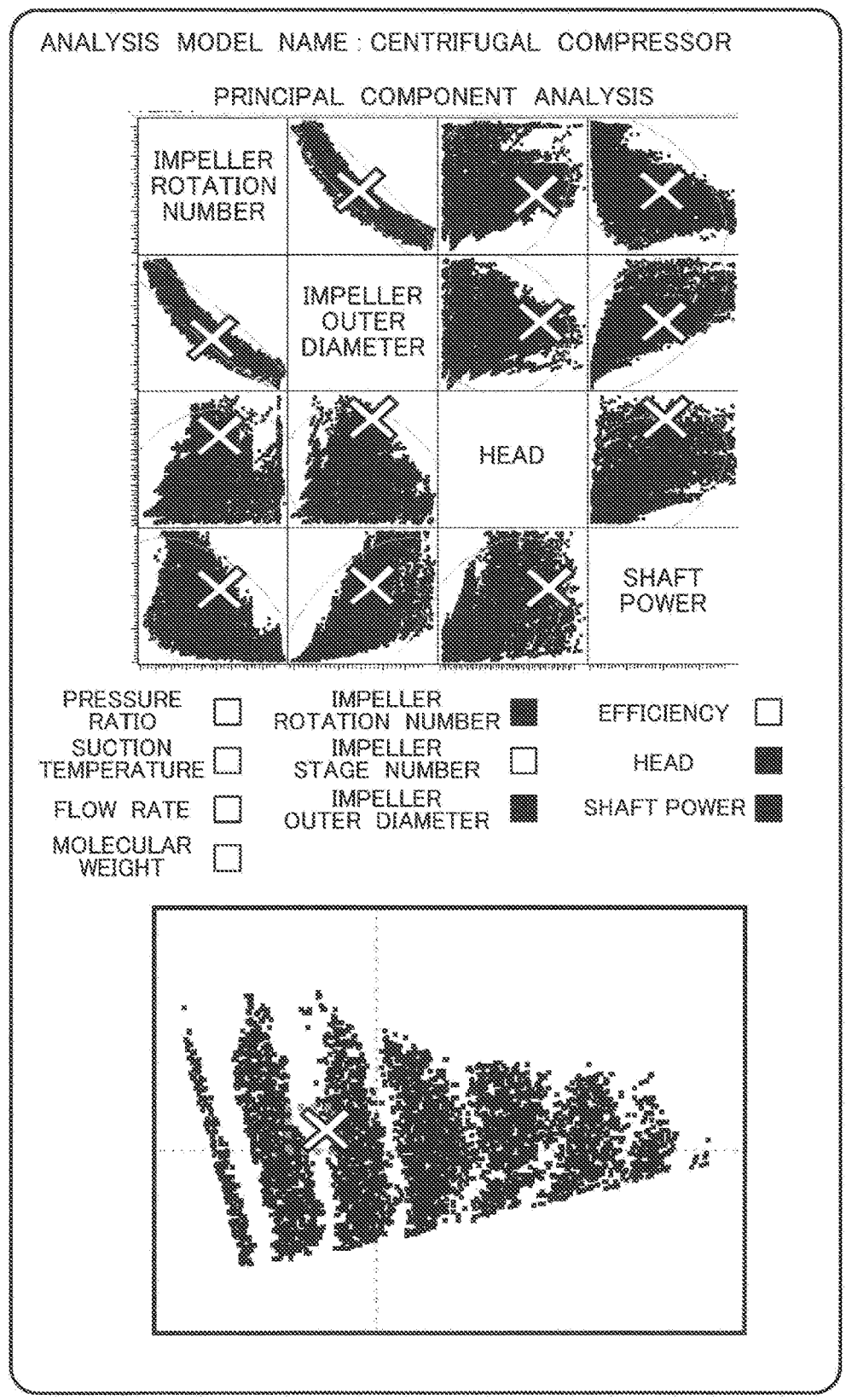
FIG. 8 illustrates a diagram of one example of a display screen for a design space.

In S601, the design space visualizing unit 107 displays the design space. FIG. 8 illustrates one example of a display screen of the design space. Scatter diagrams are displayed in the upper part of the display screen. The scatter diagrams illustrate the correlation between the impeller rotation number, impeller outer diameter, head, and shaft effect with respect to the data obtained by the parameter survey in the phase 1. In the scatter diagram, taking the "impeller outer diameter" on a diagonal for an example, the vertical axis of a row of the "impeller outer diameter" means the impeller outer diameter, and the horizontal axis of a column means the impeller outer diameter. That is, in the scatter diagram positioned in the second row and the third column, the vertical axis means the impeller outer diameter, and the horizontal axis means the head. The diagrams are symmetrical with respect to the diagonal owing to the nature thereof.

It should be noted that a scatter diagram with other parameters can be displayed by freely selecting the input and output parameters. In addition, a scatter diagram is in the lower part of the display screen. The scatter diagram is obtained by principal component analysis with respect to the data obtained by the parameter survey in the phase 1. In the figure, x indicates the design plan obtained by the design plan generating unit 105. In such a way, the operator can grasp the positional relationship of the design plan in the entire design space.

In S602, a user (worker) specifies, with the design region input unit 108, a region in the vicinity of the design plan obtained by the design plan generating unit 105 via the user interface. A widely selected region in the vicinity of the design plan leads to selection of many design plans, and a narrowly selected region in the vicinity of the design plan leads to selection of a few design plans. As illustrated by a dotted line in FIG. 8, a region in the vicinity of x is selected. Design plans in accordance with the required specification are gathered in the region in the vicinity of x. A plurality of design plans can thus be extracted by specifying the region in the vicinity of x.

In S603, the design plan display unit 109 acquires data contained in the region in the vicinity of the design plan x input by the design region input unit 108, and displays the data on the design plan display screen. FIG. 9 illustrates one example of the design plan display screen. A plurality of design plans can be obtained by displaying the data contained in the dashed region in the vicinity of the design plan x input by the design region input unit 108 in addition to one design plan obtained at the design plan generating unit 105.

As described above, the positional relationship of the input and output parameters with respect to the entire design space can be displayed to the operator by visualizing the design space, and a plurality of output parameters can be obtained by the operator specifying the range in the vicinity of the input and output parameters.

Although, in the first embodiment, the neural network is used for a method of machine learning, another method such as the Kriging method can be used. In addition, although, in the first embodiment, an analysis-node analysis constituting the analysis process is described to be performed with the same computer, the analysis-node analysis can be performed with different computers by using a network environment.

REFERENCE SIGNS LIST 101 analysis process defining unit
102 analysis condition input/display unit
103 analysis model creating and analysis controlling unit
104 machine learning unit
105 design plan generating unit
106 required specification input unit
107 design space visualizing unit
108 design region input unit
109 design plan display unit
110 database
111 computer

The invention claimed is:

1. A design support apparatus that outputs a design plan satisfying a required specification, comprising:
   an analysis controlling means that generates a sampling point in design space based on an input parameter, performs calculation under a condition in accordance with the sampling point, and acquires a calculation result as an output parameter;
   a machine learning means that performs machine learning on a relationship between the input parameter and the output parameter;
   a design plan generating means that calculates a design plan corresponding to the required specification with reference to information learned by the machine learning means;

a visualizing means that visualizes the design space, and displays the calculation result and the design plan calculated by the design plan generating means in the visualized design space;

a means that specifies a region in a vicinity of the design plan calculated by the design plan generating means in the visualized design space; and a means that outputs the calculation result contained in the region in the vicinity of the design plan calculated by the design plan generating means as a design plan satisfying the required specification;

a means that displays an analysis process input screen and displays an analysis process by selecting an analysis node in which an analysis program is built; and a means that displays an analysis condition input screen, displays an input condition necessary for analysis, and acquires an input parameter in accordance with the input condition.

2. A design support apparatus that outputs a design plan satisfying a required specification, comprising:

an analysis controlling means that generates a sampling point in design space based on an input parameter, performs calculation under a condition in accordance with the sampling point, and acquires a calculation result as an output parameter;

a machine learning means that performs machine learning on a relationship between the input parameter and the output parameter;

a design plan generating means that calculates a design plan corresponding to the required specification with reference to information learned by the machine learning means;

a visualizing means that visualizes the design space, and displays the calculation result and the design plan calculated by the design plan generating means in the visualized design space;

a means that specifies a region in a vicinity of the design plan calculated by the design plan generating means in the visualized design space; and a means that outputs the calculation result contained in the region in the vicinity of the design plan calculated by the design plan generating means as a design plan satisfying the required specification;

wherein the machine learning means performs machine learning on a relationship between the input parameter and the output parameter by a method through a neural network, and the design plan generating means generates a design plan satisfying the required specification through the neural network with reference to information learned by the machine learning means.

3. A design support apparatus that outputs a design plan satisfying a required specification, comprising:

an analysis controlling means that generates a sampling point in design space based on an input parameter, performs calculation under a condition in accordance with the sampling point, and acquires a calculation result as an output parameter;

a machine learning means that performs machine learning on a relationship between the input parameter and the output parameter;

a design plan generating means that calculates a design plan corresponding to the required specification with reference to information learned by the machine learning means;

a visualizing means that visualizes the design space, and displays the calculation result and the design plan calculated by the design plan generating means in the visualized design space;

a means that specifies a region in a vicinity of the design plan calculated by the design plan generating means in the visualized design space; and a means that outputs the calculation result contained in the region in the vicinity of the design plan calculated by the design plan generating means as a design plan satisfying the required specification;

wherein the visualizing means displays a calculation result from the analysis controlling means in a scatter diagram representing a correlation between the input parameter and any parameter in the output parameter and a scatter diagram obtained by principal component analysis.

* * * * *